US012593536B2

(12) United States Patent (10) Patent No.: US 12,593,536 B2

Lee et al. (45) Date of Patent: Mar. 31, 2026

(54) QUANTUM DOT AND LIGHT EMITTING DEVICE INCLUDING THE SAME

(71) Applicant: SAMSUNG ELECTRONICS CO., LTD., Suwon-si (KR)

(72) Inventors: Daehee Lee, Suwon-si (KR); Yuho Won, Suwon-si (KR); Wonsik Yoon, Suwon-si (KR); Taehyung Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 438 days.

(21) Appl. No.: 18/244,661

(22) Filed: Sep. 11, 2023

(65) Prior Publication Data

US 2024/0097068 A1 Mar. 21, 2024

Related U.S. Application Data

(63) Continuation of application No. PCT/KR2023/010855, filed on Jul. 26, 2023.

(30) Foreign Application Priority Data

Sep. 20, 2022 (KR) ........................ 10-2022-0118914

(51) Int. Cl.
| | |
|---|---|
| *H10H 20/812* | (2025.01) |
| *B82Y 20/00* | (2011.01) |
| *H10H 20/823* | (2025.01) |
| *H10H 20/824* | (2025.01) |

(52) U.S. Cl.
CPC ........ *H10H 20/812* (2025.01); *H10H 20/823* (2025.01); *H10H 20/824* (2025.01); *B82Y 20/00* (2013.01)

(58) Field of Classification Search
CPC ... H10H 20/812; H10H 20/823; H10H 20/824
See application file for complete search history.

(56) References Cited

U.S. PATENT DOCUMENTS

| | | |
|---|---|---|
| 10,074,770 B2 | 9/2018 | Park et al. |
| 10,640,703 B2 | 5/2020 | Sasaki |
| 11,050,033 B2 | 6/2021 | Kim et al. |
| | (Continued) | |

FOREIGN PATENT DOCUMENTS

| | | |
|---|---|---|
| CN | 107286924 A | 10/2017 |
| KR | 10-2015-0034621 A | 4/2015 |
| | (Continued) | |

OTHER PUBLICATIONS

Communication dated Jul. 10, 2025, issued by the European Patent Office in European Application No. No. 23868359.3.

(Continued)

*Primary Examiner* — Mark W Tornow

(74) *Attorney, Agent, or Firm* — Sughrue Mion, PLLC

(57) ABSTRACT

A quantum dot of a light emitting device, includes: a core; and a shell around the core and including halogen elements of at least one type, wherein a first number per unit volume of halogen elements in a first area of the shell, that includes an outer surface of the shell, is larger than a second number per unit volume of halogen elements in a second area of the shell other than the outer surface of the shell.

16 Claims, 10 Drawing Sheets

(56)  References Cited

U.S. PATENT DOCUMENTS

| | | | | |
|---|---|---|---|---|
| 11,251,390 | B2 * | 2/2022 | Chung | H10K 71/15 |
| 11,254,863 | B2 | 2/2022 | Kim et al. | |
| 11,667,838 | B2 | 6/2023 | Moriyama et al. | |
| 11,718,786 | B2 | 8/2023 | Kim et al. | |
| 2015/0041759 | A1 * | 2/2015 | Kahen | H10H 20/811 |
| | | | | 438/47 |
| 2015/0083969 | A1 * | 3/2015 | Kim | C09K 11/705 |
| | | | | 977/774 |
| 2017/0179338 | A1 | 6/2017 | Park et al. | |
| 2018/0094190 | A1 | 4/2018 | Kim et al. | |
| 2019/0112527 | A1 | 4/2019 | Moriyama et al. | |
| 2020/0263083 | A1 | 8/2020 | Kim et al. | |
| 2021/0301202 | A1 * | 9/2021 | Ko | C01G 15/006 |
| 2022/0169921 | A1 | 6/2022 | Kim et al. | |
| 2023/0265342 | A1 | 8/2023 | Moriyama et al. | |

FOREIGN PATENT DOCUMENTS

| | | |
|---|---|---|
| KR | 10-2016-0135874 A | 11/2016 |
| KR | 10-2017-0074585 A | 6/2017 |
| KR | 10-2019-0003598 A | 1/2019 |
| KR | 10-2020-0100011 A | 8/2020 |
| KR | 10-2020-0122933 A | 10/2020 |
| KR | 10-2022-0091668 A | 7/2022 |
| WO | 2017/038487 A1 | 3/2017 |

OTHER PUBLICATIONS

International Search Report (PCT/ISA/210) issued Nov. 20, 2023 by the International Searching Authority in International Patent Application No. PCT/KR2023/010855.

Written Opinion (PCT/ISA/237) issued Nov. 20, 2023 by the International Searching Authority in International Patent Application No. PCT/KR2023/010855.

Kang, Byoung-Ho et al., "Efficient exciton generation in atomic passivated CdSe/ZnS quantum dots light-emitting devices", Scientific Reports, Sep. 30, 2016, vol. 6, No. 34659, pp. 1-8.

Communication dated Jan. 20, 2026 issued by the Korean Ministry of Intellectual Property in Korean Patent Application No. 10-2022-0118914.

* cited by examiner

QUANTUM DOT AND LIGHT EMITTING DEVICE INCLUDING THE SAME

CROSS-REFERENCE TO RELATED APPLICATION(S)

This application is a bypass continuation of International Application No. PCT/KR2023/010855, filed on Jul. 26, 2023, which is based on and claims priority to Korean Patent Application No. 10-2022-0118914 filed on Sep. 20, 2022, in the Korean Intellectual Property Office, the disclosures of which are incorporated by reference herein in their entireties.

BACKGROUND

1. Field

The disclosure relates to a quantum dot, having improved performance by introducing halogen elements thereto, and a light emitting device including the same.

2. Description of the Related Art

A light emitting diode (LED) of a light emitting device may be formed in a p-n junction structure of a semiconductor, and electrons and holes injected from electrodes meet at the p-n junction and generate light having a wavelength corresponding to an energy band gap, an energy difference between the electrons and the holes.

Various types of LEDs such as organic light emitting diodes (OLEDs) and quantum dot-light emitting diodes (QD-LEDs) have been developed and used.

The QD-LEDs use quantum dots as a light emitting source, each of the quantum dots having a core/shell structure consisting of a core including a nanoscale semiconductor crystal and a shell surrounding the periphery of the core. The QD-LEDs provide improved performance by exploiting a quantum confinement effect resulting from sizes of the nanoscale semiconductor crystals of the quantum dots. The QD-LEDs are capable of generating light having different wavelengths by adjusting the sizes of nanocrystals without changing the types of materials that form the semiconductor crystals. Therefore, the QD-LEDs are capable of obtaining various colors, and have an improved effect as compared to conventional LEDs in terms of color purity and lifespan.

QD-LEDs having improved efficiency and lifetime are being developed through research on compounds constituting quantum dots and synthesis processes therefor.

SUMMARY

According to an aspect of the disclosure, a quantum dot of a light emitting device, includes: a core; and a shell around the core and including halogen elements of at least one type, wherein a first number per unit volume of halogen elements in a first area of the shell, that includes an outer surface of the shell, is larger than a second number per unit volume of halogen elements in a second area of the shell other than the outer surface of the shell.

The halogen elements in the first area of the shell may include halogen elements of two or more types, and the halogen elements in the second area of the shell may include halogen elements of one type.

The halogen elements may include at least one of fluorine, chlorine, bromine, or iodine, and the halogen elements may be in a doped state or a metal halide state inside the shell or on the outer surface of the shell.

The shell may include a plurality of monolayers stacked on each other, and the outer surface of the shell may be an outermost monolayer of the plurality of monolayers.

The shell may include a plurality of monolayers stacked on each other, and a number of the plurality of monolayers may be in a range from 8 to 20.

The core may include a Group III-V compound, and the Group III-V compound may be at least one of: a binary element compound selected from the group consisting of GaN, GaP, GaAs, GaSb, AlN, AlP, AlAs, AlSb, InN, InP, InAs, InSb, and mixtures thereof; a ternary element compound selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, and mixtures thereof; or a quaternary element compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof.

The core may include a Group II-VI compound, and the Group II-VI compound is at least one of: a binary element compound selected from the group consisting of ZnS, ZnSe, ZnTe, ZnO, HgS, HgSe, HgTe, MgSe, MgS, and mixtures thereof; a ternary element compound selected from the group consisting of ZnSeS, ZnSeTe, ZnSTe, HgSeS, HgSeTe, HgSTe, HgZnS, HgZnSe, HgZnTe, MgZnSe, MgZnS, and mixtures thereof; or a quaternary element compound selected from the group consisting of HgnTeS, HgZnSeS, HgZnSeTe, HgZnSTe, and mixtures thereof.

The quantum dot may include a quantum yield of at least 70%.

According to an aspect of the disclosure, a display panel includes: a substrate; and a light emitting device provided on the substrate and including at least one quantum dot, wherein the at least one quantum dot includes: a core; and a shell around the core and including halogen elements of at least one type, and a first number per unit volume of the halogen elements in a first area of the shell, that may include an outer surface of the shell, is larger than a second number per unit volume of the halogen elements in a second area of the shell other than the outer surface of the shell.

The halogen elements in the first area of the shell may include halogen elements of two or more types, and the halogen elements in the second area of the shell may include halogen elements of one type.

The halogen elements may include at least one of fluorine, chlorine, bromine, or iodine, and the halogen elements may be in a doped state or a metal halide state inside the shell or on the outer surface of the shell.

The shell may include a plurality of monolayers stacked on each other, and the outer surface of the shell may be an outermost monolayer of the plurality of monolayers.

The shell may include a plurality of monolayers stacked on each other, and a number of the plurality of monolayers may be in a range from 8 to 20.

The core may include a Group III-V compound, and the Group III-V compound may be at least one of: a binary element compound selected from the group consisting of GaN, GaP, GaAs, GaSb, AlN, AlP, AlAs, AlSb, InN, InP, InAs, InSb, and mixtures thereof; a ternary element compound selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, and mixtures thereof; or a quaternary element compound selected from the group consisting of GaAlNP, GaAlNAs, GaAlNSb, GaAlPAs, GaAlPSb, GaInNP, GaInNAs, GaInNSb, GaIn-PAs, GaInPSb, InAlNP, InAlNAs, InAlNSb, InAlPAs, InAlPSb, and mixtures thereof.

The core may include a Group II-VI compound, and the Group II-VI compound may be at least one of: a binary element compound selected from the group consisting of ZnS, ZnSe, ZnTe, ZnO, HgS, HgSe, HgTe, MgSe, MgS, and mixtures thereof; a ternary element compound selected from the group consisting of ZnSeS, ZnSeTe, ZnSTe, HgSeS, HgSeTe, HgSTe, HgZnS, HgZnSe, HgZnTe, MgZnSe, MgZnS, and mixtures thereof; or a quaternary element compound selected from the group consisting of HgZnTeS, HgZnSeS, HgZnSeTe, HgZnSTe, and mixtures thereof.

The at least one quantum dot may include a quantum yield of at least 70%.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
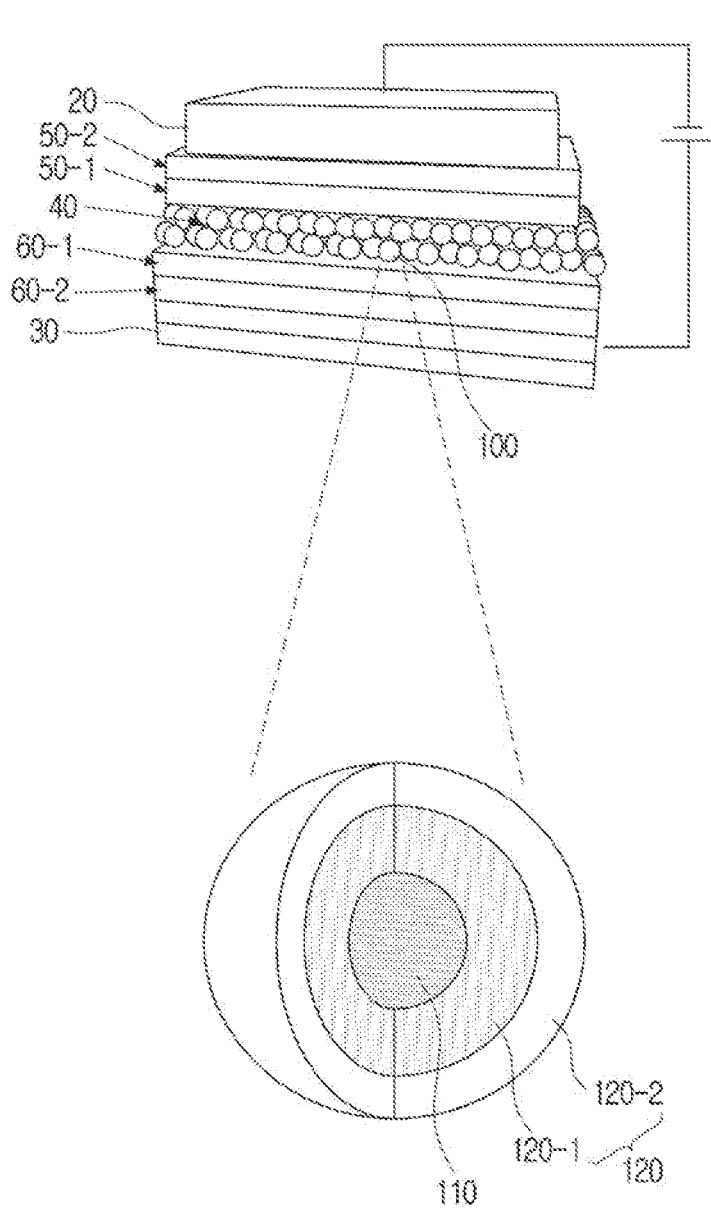
FIG. 1 is a diagram for explaining structures of a quantum dot and a light emitting device including the same, the light emitting device being included in a display panel, according to one or more embodiments of the disclosure.

The embodiments may be diversely modified, and there may be various embodiments, and accordingly, specific embodiments are illustrated in the drawings and are described in detail in the detailed description. However, it should be understood that there is no intent to limit the scope of the disclosure to the particular forms disclosed herein, and rather, the disclosure should be construed to cover various modifications, equivalents, and/or alternatives of embodiments of the disclosure. In describing the drawings, similar reference signs may be used to denote similar components.

In describing the disclosure, when it is determined that a detailed description of relevant known functions or configurations may unnecessarily obscure the gist of the disclosure, the detailed description thereof will be omitted.

In addition, the following embodiments may be modified in many different forms, and the scope of the technical spirit of the disclosure is not limited to the following embodiments. Rather, these embodiments are provided to make the disclosure more thorough and complete and to fully transfer the technical spirit of the disclosure to those skilled in the art.

The terms used herein are only to describe particular embodiments and are not intended to limit the scope of the disclosure. Singular expressions include plural expressions unless the context clearly indicates otherwise.

The expression "have", "may have", "include", "may include", or the like used herein indicates the presence of stated features (e.g., components such as numerical values, functions, operations, or parts) and does not preclude the presence of additional features.

The expression "A or B", "at least one of A and/or B", "one or more of A and/or B", or the like used herein may include all possible combinations of items enumerated therewith. For example, the expressions "A or B", "at least one of A and B", or "at least one of A or B" indicates only A, (2) only B, or (3) both A and B.

The expressions "first", "second", and the like used herein may modify various components regardless of order and/or importance, and may be used to distinguish one component from another component, and do not limit the components.

The expression "configured to (or set to)" used herein may be used interchangeably with the expression "suitable for", "having the capacity to", "designed to", "adapted to", "made to", or "capable of" according to a context. The term "configured to (set to)" does not necessarily mean "specifically designed to" in hardware.

When a part such as a layer, a film, a region, or a plate is referred to as being "on" another part herein, it may be "directly on" the another part or there may be an intervening part therebetween. In contrast, when a part is referred to as being "directly on" another part, there is no intervening part therebetween.

The term "group" corresponding to a compound or an element used herein refers to a group of the Periodic Table of Elements.

Various elements and regions in the drawings are schematically illustrated. Thus, the technical spirit of the disclosure is not limited by relative sizes or distances shown in the drawings.

Hereinafter, embodiments according to the disclosure will be described in detail with reference to the accompanying drawings so that the embodiments can be easily carried out by those having ordinary knowledge in the art to which the disclosure pertains.

FIG. 1 is a diagram for explaining structures of a quantum dot and a light emitting device including the same according to one or more embodiments of the disclosure.

Referring to FIG. 1, a light emitting device 10 including quantum dots of a display panel may be formed on a substrate. The light emitting device 10 including quantum dots may be a quantum dot-light emitting diode (QD-LED), but is not limited thereto. In addition, one or more light emitting devices 10 including quantum dots may constitute RGB pixels and sub-pixels, which are basic units of the display panel.

In addition, an electric circuit for controlling the light emitting device 10 including quantum dots may be formed on the substrate. The electric circuit may include electrodes, diodes (e.g. light emitting diodes (LEDs)), and transistors (e.g. bipolar junction transistors (BJTs), junction field effect transistors (JFETs), insulated gate field effect transistors (IGFETs), metal oxide semiconductor field effect transistors (MOSFETs), and thin film transistors (TFTs)).

However, the configuration of the electric circuit is not limited thereto, and various configurations for emitting light to operate as a display panel may be further included or some configurations may be omitted.

The light emitting device 10 of the display panel may include a positive electrode 20 disposed on the substrate and a negative electrode 30 disposed to be spaced apart from the positive electrode 20 on the substrate.

Here, the positive electrode 20 may be made of Al, and the negative electrode 30 may be made of an indium tin oxide (ITO), but the positive electrode 20 and the negative electrode 30 are not limited thereto, and may be made of various materials that can be used as electrodes.

The light emitting device 10 of the display panel may include a light emitting layer 40, disposed between the positive electrode 20 and the negative electrode 30 on the substrate, including at least one quantum dot 100.

The light emitting device 10 of the display panel may include an electron transport layer 50-1, disposed between the positive electrode 20 and the light emitting layer 40 on the substrate, and a hole transport layer 60-1 disposed between the negative electrode 30 and the light emitting layer 40 on the substrate.

Here, the light emitting device 10 of the display panel may further include an electron injection layer 50-2, between the electron transport layer 50-1 and the positive electrode 20, and may further include a hole injection layer 60-2 between the hole transport layer 60-1 and the negative electrode 30.

Electrons may move from the positive electrode 20 to the light emitting layer 40 through the electron injection layer 50-2 and the electron transport layer 50-1, and holes may move from the negative electrode 30 to the light emitting layer 40 through the hole injection layer 60-2 and the hole transport layer 60-1.

Here, the light emitting layer 40 may include at least one quantum dot 100, and the quantum dot 100 may include a core 110 made of a semiconductor nanocrystal, and at least one shell 120 disposed on the core 110 and having a crystalline or amorphous structure. As illustrated in FIG. 1, the at least one shell 120 may include two shells 120-1 and 120-2. However, the number of shells is not limited to two, and may be one or may be more than two. Hereinafter, the shells 120-1 and 120-2 will be collectively referred to as shell 120.

The electrons and holes receive a quantum confinement effect of the nanoscale semiconductor crystal constituting the quantum dot 100 included in the light emitting layer 40 to emit light having a wavelength corresponding to an energy difference between the electrons and holes.

The core 110 of the quantum dot 100 according to one or more embodiments of the disclosure may include a semiconductor nanocrystal made of a Group III-V compound or a Group II-VI compound. However, the core 110 of the quantum dot 100 is not limited thereto.

Here, the Group III-V compound constituting the core 110 may be at least one of: a binary element compound selected from the group consisting of GaN, GaP, GaAs, GaSb, AlP, AlAs, AlSb, InN, InP, InAs, InSb, and mixtures thereof; a ternary element compound selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, and mixtures thereof; or a quaternary element compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof. When the core 110 is made of the III-V compound, light generated through the quantum dot 100 has a red color.

In addition, the core 110 may include a Group II-VI compound, and the Group II-VI compound may be at least one of a binary element compound selected from the group consisting of ZnS, ZnSe, ZnTe, ZnO, HgS, HgSe, HgTe, MgSe, MgS, and mixtures thereof; a ternary element compound selected from the group consisting of ZnSeS, ZnSeTe, ZnSTe, HgSeS, HgSeTe, HgSTe, HgZnS, HgZnSe, HgZnTe, MgZnSe, MgZnS, and mixtures thereof; or a quaternary element compound selected from the group consisting of HgZnTeS, HgZnSeS, HgZnSeTe, HgZnSTe, and mixtures thereof. When the core 110 is made of the Group II-VI compound, light generated through the quantum dot 100 has a blue color.

The shell 120 of the quantum dot 100 may include a crystalline or amorphous compound. According to one or more embodiments, the shell 120 may be made of a compound such as ZnS, ZnSe, or ZnSeS, but is not limited thereto.

The shell 120 may include a ligand coordinate-bonded to a central metal atom of the compound constituting the shell 120. The ligand may be oleic acid (OA), but is not limited thereto, and may include various types of organic ligands.

The oleic acid ligand included in the shell 120 may include an alkyl chain, and the alkyl chain is a factor that hinders the injection and transport of electrons and holes. Therefore, in order to solve the foregoing problem, the oleic acid ligand is reduced by using a halogen element (e.g., chlorine (Cl)) in a step of synthesizing the quantum dot 100, and the oleic acid ligand that is not separated in the synthesis step is removed through a post-treatment process.

The removal of the oleic acid ligand present on the surface of the quantum dot 100 through the post-treatment process as described above may cause defects on the surface of the quantum dot 100, resulting in a problem that the photoluminescence intensity (PL) of the quantum dot 100 decreases.

Figure 2:
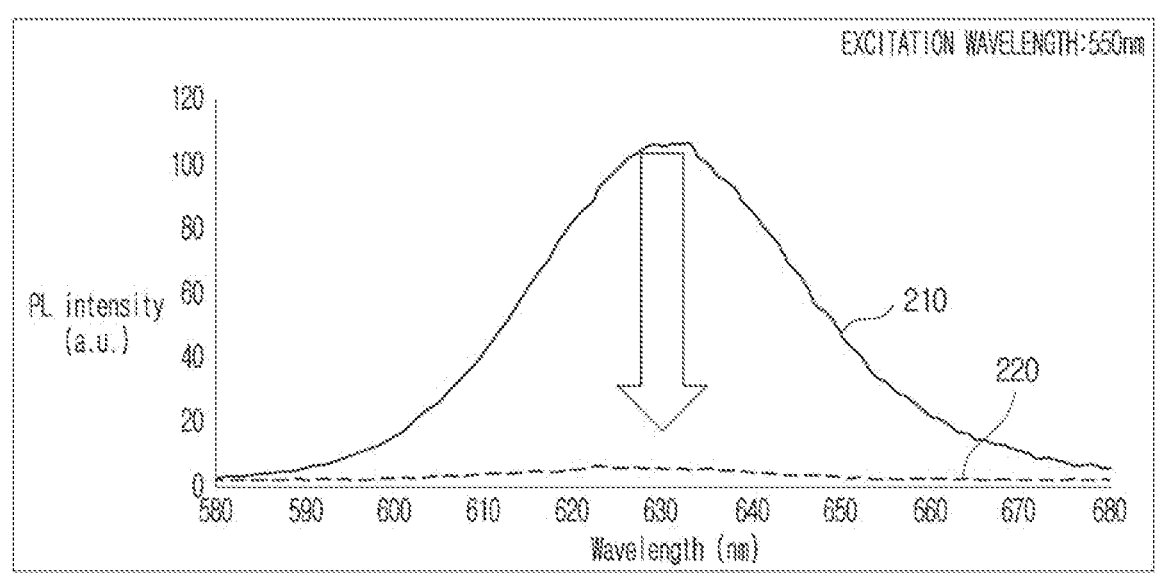
FIG. 2 is a diagram for explaining a change in photoluminescence (PL) intensity resulting from a ligand removal process in the course of manufacturing the quantum dot according to one or more embodiments of the disclosure.

FIG. 2 is a diagram for explaining a change in photoluminescence intensity resulting from the ligand removal process in the course of manufacturing the quantum dot according to one or more embodiments of the disclosure.

Referring to FIG. 2, in a case where the quantum dot 100 emits red light and chlorine (Cl) is introduced to the quantum dot 100, it can be seen, from a comparison between a graph 210, indicating the photoluminescence intensity of the quantum dot 100 before the ligand removal process, and a graph 220, indicating the photoluminescence intensity of the quantum dot 100 after the ligand removal process, that the photoluminescence intensity of the quantum dot 100 decreases by about 50% to 95% in a wavelength range of 620 nm to 650 nm.

The effect of the ligand removal process on the reduction of the photoluminescence intensity of the quantum dot 100 can be shown in Table 1 below.

TABLE 1

|  | Before ligand removal process | After ligand removal process |
|---|---|---|
| Photoluminescence intensity (a.u.) | 106.2 | 5.7 |
| Wavelength (nm) having largest photoluminescence intensity | 632 | 632 |

Therefore, it is required to find a method for improving the performance and lifespan of the quantum dot 100 by more effectively removing the oleic acid ligand present on the surface of the quantum dot 100 and minimizing the surface defects that occur after the post-treatment process for removing the oleic acid ligand.

In order to achieve the above-described object, a halogen element may be introduced to the quantum dot 100, and in particular, the halogen element may be introduced to the surface of the quantum dot 100.

Figure 3:
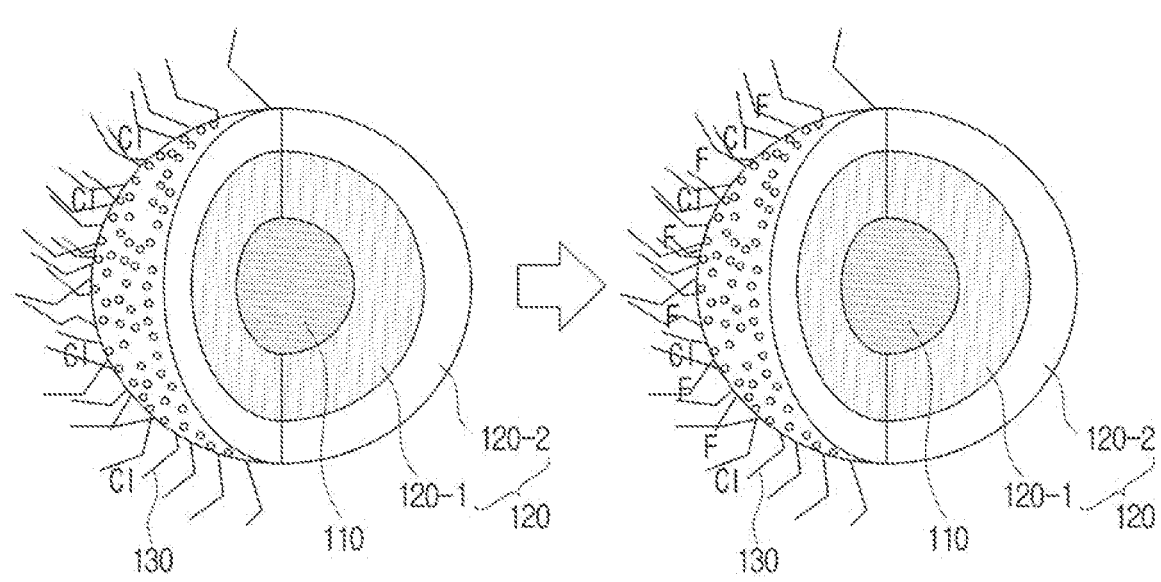
FIG. 3 is a diagram for explaining a structure of the quantum dot subjected to surface treatment using halogen elements according to one or more embodiments of the disclosure.

FIG. 3 is a diagram for explaining a structure of the quantum dot subjected to surface treatment using the halogen elements according to one or more embodiments of the disclosure.

Referring to FIG. 3, the quantum dot 100 according to the disclosure for achieving the above-described object may include a core 110 including a semiconductor nanocrystal, and at least one shell 120 formed on the core 110, being crystalline or amorphous, and including halogen elements 130 of at least one type. As illustrated in FIG. 3, the at least one shell 120 may include two shells 120-1 and 120-2.

That is, in a step of synthesizing the quantum dot 100, the halogen elements 130 may be introduced to the shell 120 to remove the oleic acid ligand, thereby minimizing the hindrance of electron and hole transport that is caused by the alkyl chain of the oleic acid.

The halogen elements 130 may be at least one of fluorine (F), chlorine (Cl), bromine (Br), or iodine (I), and may be present in a doped state in the shell 120 or on the outer surface of the shell 120 or in a metal halide state.

Here, the number per unit volume of the halogen elements 130 present in a first area that includes the outer surface of the shell 120 may be larger than the number per unit volume of halogen elements 130 present in a second area of the shell 120 that does not include the outer surface of the shell 120. Here, the first area may be an area including the outermost surface of the shell 120.

The first area may be an area referring to only the outermost surface of the shell 120. The second area may be an inner area of the shell 120 that does not include the surface of the shell 120. Also, the first area may closer than the second area to the outermost surface of the shell 120. In addition, a point closest to the core 110 in the first area may be closer to the outer surface than a point closest to the outer surface in the second area. However, the above-described first and second areas of the shell 120 are not limited thereto.

The number per unit volume of the halogen elements 130 present in the first area that includes the surface of the shell 120 may be larger than the number per unit volume of halogen elements 130 present in the second area of the shell 120 that does not include the surface of the shell 120, by additionally introducing the halogen elements 130 to the area including the surface of the shell 120 immediately after synthesizing the shell 120 by introducing the halogen elements 130 in the course of manufacturing the quantum dot 100 according to the disclosure.

The shell 120 may include halogen elements 130 of two or more types in the first area including the surface of the shell 120. Here, the halogen elements of two or more types included in the first area of the shell 120 may be chlorine (Cl) and fluorine (F), but are not limited thereto.

The halogen elements 130 present in the second area of the shell 120 that does not include the surface of the shell 120 may be only chlorine (Cl), which is one type of halogen element, but are not limited thereto.

The halogen elements 130 present on the surface of the shell 120 may be present in a doped state or in a metal halide state.

A method of manufacturing the quantum dot 100 in which two or more kinds of halogen elements 130 are introduced to the surface of the shell 120 will be described below.

In a case where the core 110 of the quantum dot 100 that emits red light is made of InP, indium acetate and palmitic acid are dissolved in 1-octadecene inside a 200 mL reaction flask, and the reaction flask is heated to 120° C. in a vacuum state. A molar ratio of indium and palmitic acid is 1:3. After 1 hour, the atmosphere in the reactor is changed to nitrogen. After the reactor is heated to 280° C., a mixed solution of tris(trimethylsilyl)phosphine (TMS3P) and trioctylphosphine is quickly injected into the reactor and subjected to reaction for 20 minutes. A precipitate obtained through centrifugation with acetone put into the reaction solution quickly cooled to room temperature is dispersed back in toluene. TMS3P is contained in an amount of 0.5 mol per 1 mol of indium. The obtained InP core has a size of about 3 nm.

In order to obtain ZnSe and ZnS, TOA is put into a 300 mL reaction flask, zinc acetate and oleic acid are added in a molar ratio of 1:2, and then the reaction flask is treated at 120° C. in a vacuum state. The atmosphere inside the flask is replaced with nitrogen (N2). A toluene dispersion is quickly added to a ZnSeTe core prepared by heating the reaction flask up to 300° C., and subsequently, a Se/TOP stock solution is added, followed by reaction for 120 minutes. As a result, a ZnSe layer is formed on the core. Next, a ZnS layer is formed on the ZnSe layer by adding S/Top stock solution together with zinc acetate, followed by reaction for 120 minutes. A molar ratio in content of a Zn precursor, a S precursor, and a Se precursor used to form a shell is 3.5:2.5:1.

The synthesized solution including InP, ZnSe, and ZnS is washed twice with ethanol added thereto in an amount of three times or more, and then dispersed in cyclohexane. A ZnCl2 solution (10 vol % in acetone) and an HF-diluted solution (10 vol % in acetone) contained in an amount of 0.1% to 500% of Zn on the surface are added and subjected to reaction at 80° C. for 1 hour. After being cooled to room temperature, the reaction solution is washed twice with ethanol added thereto in an amount of three times or more, and then dispersed in octane. Here, the chlorine (Cl) precursor is not limited to ZnCl2, and the fluorine (F) precursor is not limited to HF.

In a case where the core 110 of the quantum dot 100 that emits blue light is made of ZnTeSe, selenium, sulfur, and tellurium are dispersed in trioctylphosphine (TOP) to obtain a 2M Se/TOP stock solution, and a 2M sulfur/TOP stock solution, and a 0.1M Te/TOP stock solution. Inside a 300 mL reaction flask, zinc acetate is dissolved in trioctylamine together with palmitic acid, and the reaction flask is heated to 120° C. in a vacuum state. After 1 hour, the atmosphere in the reactor is changed to an inert gas. After the reactor is heated to 300° C., the Se/TOP stock solution and the Te/TOP stock solution prepared as described above are quickly injected into the reactor in a predetermined Te/Se ratio. After 60 minutes, a precipitate obtained through centrifugation with acetone put into the reaction solution quickly cooled to room temperature is dispersed in toluene to obtain a ZnSeTe core. A content ratio (Zn:Se) of the Zn precursor and the Se precursor used is 2:1, and a content ratio of Te to Se is 0.03 (Te/Se).

The method of synthesizing ZnSe and ZnS may be the same as described above in relation to the synthesis of the quantum dot 100 that generates red light, but is not limited thereto.

The synthesized solution including ZnTeSe, ZnSe, and ZnS is washed twice with ethanol added thereto in an amount of three times or more, and then dispersed in cyclohexane. A ZnCl2 solution (10 vol % in acetone) and an HF-diluted solution (10 vol % in acetone) contained in an amount of 0.1% to 500% of Zn on the surface are added and subjected to reaction at 80° C. for 1 hour. After being cooled to room temperature, the reaction solution is washed twice with ethanol added thereto in an amount of three times or more, and then dispersed in octane. Here, the chlorine (Cl) precursor is not limited to ZnCl2, and the fluorine (F) precursor is not limited to HF.

By additionally introducing the halogen elements 130 to the area including the surface of the shell 120 immediately after synthesizing the shell 120 by introducing the halogen elements 130 as described above, the oleic acid ligand present in the area including the surface of the shell 120 can be effectively removed, and there are few defects in the area including the surface of the shell 120 even after the ligand removal process, thereby expecting the effect of improving the photoluminescence intensity and the lifespan of the quantum dot 100. The quantum dot 100 may have a quantum yield of 70% or more, but is not limited thereto.

The effect expected when the number per unit volume of the halogen elements 130 present in the first area that includes the surface of the shell 120 is larger than the number per unit volume of halogen elements 130 present in the second area of the shell 120 that does not include the surface of the shell 120 by additionally introducing the halogen elements 130 to the area including the surface of the shell 120 immediately after synthesizing the shell 120 by introducing the halogen elements 130 will be described with reference to FIG. 4A, FIG. 4B, FIG. 4C, FIG. 4D, and FIG. 4E.

Figure 4A:
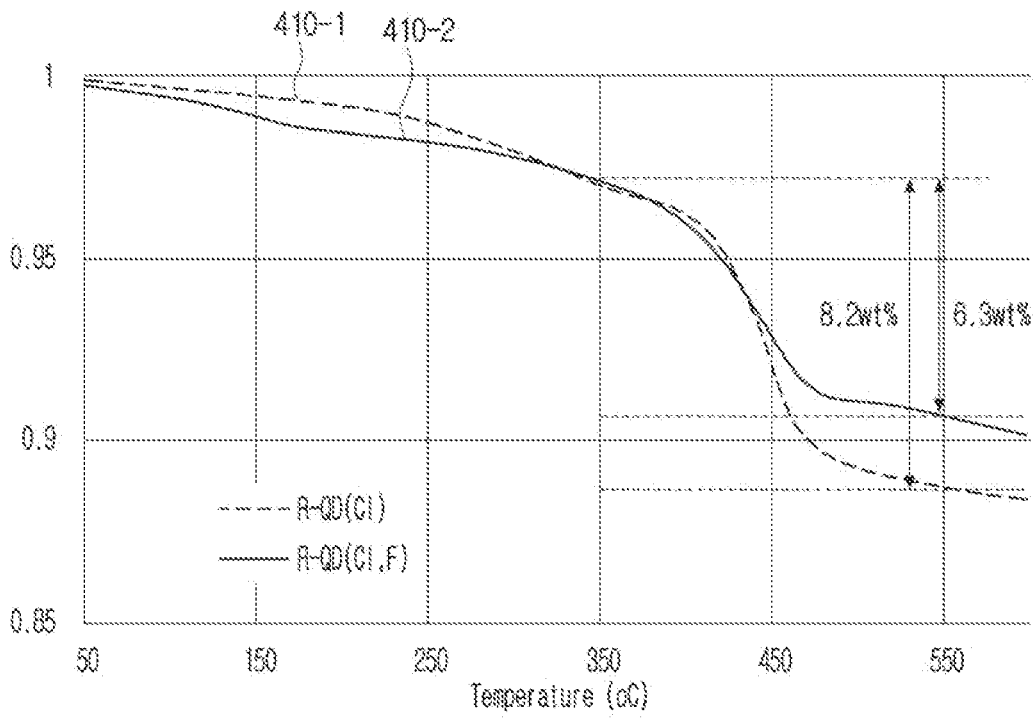
FIG. 4A is a diagram for explaining a result of thermogravimetric analysis (TGA) of the quantum dot subjected to surface treatment using the halogen elements according to one or more embodiments of the disclosure.

FIG. 4A is a diagram for explaining a result of thermogravimetric analysis (TGA) of the quantum dot 100 subjected to surface treatment using the halogen elements according to one or more embodiments of the disclosure.

Referring to FIG. 4A, it can be seen that a graph 410-1 indicating the TGA of the quantum dot 100 to which only chlorine (Cl) is introduced as the halogen elements 130 has a greater change in the range of 350° C. to 550° C. than a graph 410-2 indicating the TGA of the quantum dot 100 to which chlorine (Cl) and fluorine (F) are introduced as the halogen elements 130.

The TGA refers to a method by which a weight reduction of a sample to be analyzed due to pyrolysis can be observed due to thermal decomposition while raising a temperature in a state where the air environment in which the sample to be analyzed is located is controlled. Here, the object of pyrolysis may be an organic matter.

Therefore, it can be seen that the weight reduction caused by pyrolysis of the quantum dot 100 to which only chlorine (Cl) is introduced as the halogen elements 130 is larger than that of the quantum dot 100 to which chlorine (Cl) and fluorine (F) are introduced as the halogen elements 130. This indicates that the amount of the organic matter, that is, the oleic acid ligand including an alkyl chain, included in the quantum dot 100 to which chlorine (Cl) and fluorine (F) are introduced as the halogen elements 130 is smaller than that included in the quantum dot 100 to which only chlorine (Cl) is introduced as the halogen elements 130. Therefore, the effect of removing the oleic acid ligand and the effect of improving the performance of the quantum dot 100 can be greater when chlorine (Cl) and fluorine (F) are introduced to the quantum dot 100 as the halogen elements 130 than when only chlorine (Cl) is introduced to the quantum dot 100 as the halogen elements 130.

Fluorine (F) introduced to the above-described quantum dot 100 may be located mainly on the surface of the shell 120-2.

Figure 4B:
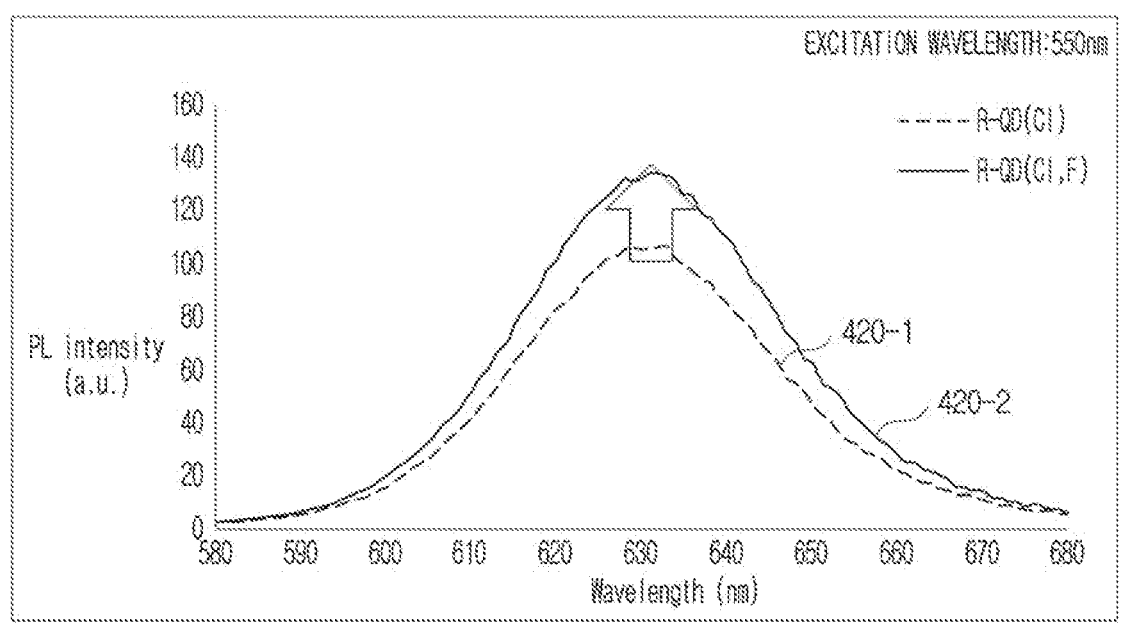
FIG. 4B is a diagram for explaining a change in photoluminescence intensity resulting from the ligand removal process in the course of manufacturing the quantum dot subjected to surface treatment using the halogen elements according to one or more embodiments of the disclosure.

FIG. 4B is a diagram for explaining a change in photoluminescence intensity resulting from the ligand removal process in the course of manufacturing the quantum dot subjected to surface treatment using the halogen elements according to one or more embodiments of the disclosure.

Referring to FIG. 4B, a graph 420-2 corresponding to the photoluminescence intensity of the quantum dot 100 to which chlorine (Cl) and fluorene (F) are introduced as the halogen elements 130 shows a larger photoluminescence intensity value in the entire wavelength range than a graph 420-1 corresponding to the photoluminescence intensity of the quantum dot 100 to which only chlorine (Cl) is introduced as the halogen elements 130.

That is, it can be seen that the photoluminescence intensity of the quantum dot 100 to which chlorine (Cl) and fluorine (F) are introduced as the halogen elements 130 has a higher value than the photoluminescence intensity of the quantum dot 100 to which only chlorine (Cl) is introduced as the halogen elements 130.

Fluorine (F) introduced to the above-described quantum dot 100 may be mainly located on the surface of the shell 120-2.

The photoluminescence intensity of the quantum dot 100 to which only chlorine (Cl) is introduced as the halogen elements 130 and the photoluminescence intensity of the quantum dot 100 to which chlorine (Cl) and fluorine (F) are introduced as the halogen elements 130 are shown in Table 2 below.

TABLE 2

|  | When Cl is introduced | When Cl and F are introduced |
|---|---|---|
| Photoluminescence intensity (a.u.) | 106.2 | 133.9 |
| Wavelength (nm) having largest photoluminescence intensity) | 632 | 632 |

Figure 4C:
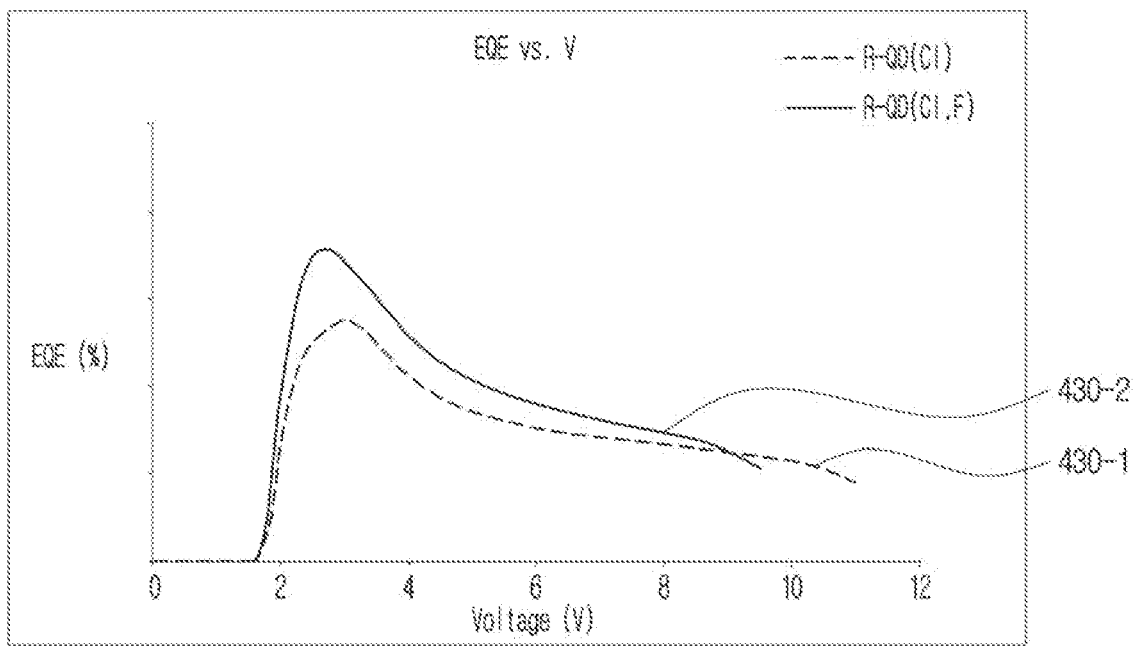
FIG. 4C is a diagram for explaining the external quantum efficiency of the quantum dot generating red light according to one or more embodiments of the disclosure.

FIG. 4C is a diagram for explaining the external quantum efficiency (EQE) of the quantum dot generating red light according to one or more embodiments of the disclosure.

Here, the external quantum efficiency refers to a rate at which excitation energy is converted into luminous energy.

Referring to FIG. 4C, it can be seen that a graph 430-2 corresponding to the external quantum efficiency of the quantum dot 100 to which chlorine (Cl) and fluorine (F) are introduced as the halogen elements 130 has a larger external quantum efficiency value in the range up to about 9 V than a graph 430-1 corresponding to the external quantum efficiency of the quantum dot 100 to which only chlorine (Cl) is introduced as the halogen elements 130.

In addition, it is shown that the maximum value of the external quantum efficiency of the quantum dot 100 to which chlorine (Cl) and fluorine (F) are introduced as the halogen elements 130 is larger by about 7% than that of the quantum dot 100 to which only chlorine (Cl) is introduced as the halogen elements 130.

Figure 4D:
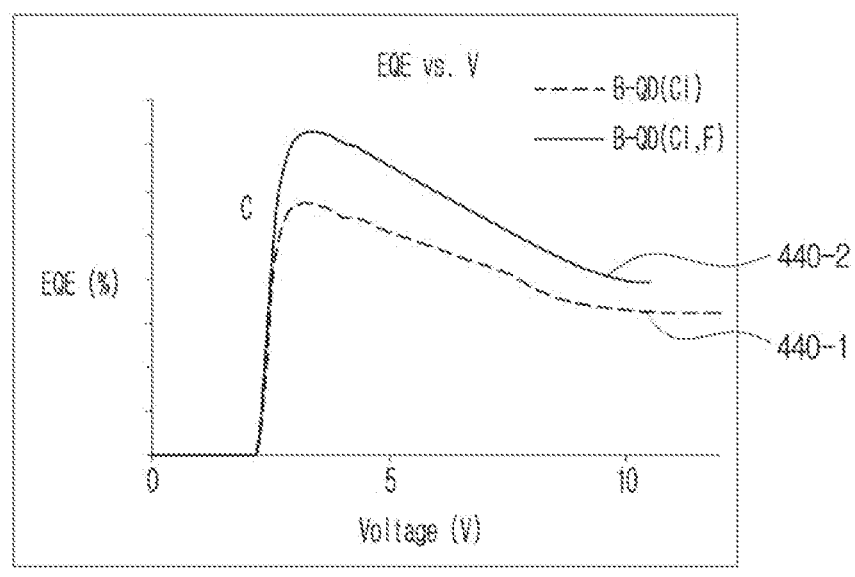
FIG. 4D is a diagram for explaining the external quantum efficiency (EQE) of the quantum dot generating blue light according to one or more embodiments of the disclosure.

FIG. 4D is a diagram for explaining the external quantum efficiency of the quantum dot generating blue light according to one or more embodiments of the disclosure.

Referring to FIG. 4D, it can be seen that a graph 440-2 corresponding to the external quantum efficiency of the quantum dot 100 to which chlorine (Cl) and fluorine (F) are introduced as the halogen elements 130 has a larger external quantum efficiency value than a graph 440-1 corresponding to the external quantum efficiency of the quantum dot 100 to which only chlorine (Cl) is introduced as the halogen elements 130.

In addition, it is shown that the maximum value of the external quantum efficiency of the quantum dot 100 to which chlorine (Cl) and fluorine (F) are introduced as the halogen elements 130 is larger by about 1.6% than that of the quantum dot 100 to which only chlorine (Cl) is introduced as the halogen elements 130.

The effect of increasing the maximum value of the external quantum efficiency of the quantum dot that generates red light when chlorine (Cl) and fluorine (F) are introduced as the halogen elements 130, and the effect of increasing the maximum value of the external quantum efficiency of the quantum dot that generates blue light when chlorine (Cl) and fluorine (F) are introduced as the halogen elements 130 can be shown in Table 3 below.

TABLE 3

|  | Quantum dot emitting red light | Quantum dot emitting blue light |
| --- | --- | --- |
| When only Cl is introduced | A % | B % |
| When Cl and F are introduced | A + 7% | B + 1.6% |

Here, fluorine (F) introduced to the quantum dot 100 may be located mainly on the surface of the shell 120-2.

Therefore, it can be seen that the quantum dot 100 to which chlorine (Cl) and fluorine (F) are introduced as the halogen elements 130 has improved efficiency and performance over the quantum dot 100 to which only chlorine (Cl) is introduced as the halogen elements 130.

Figure 4E:
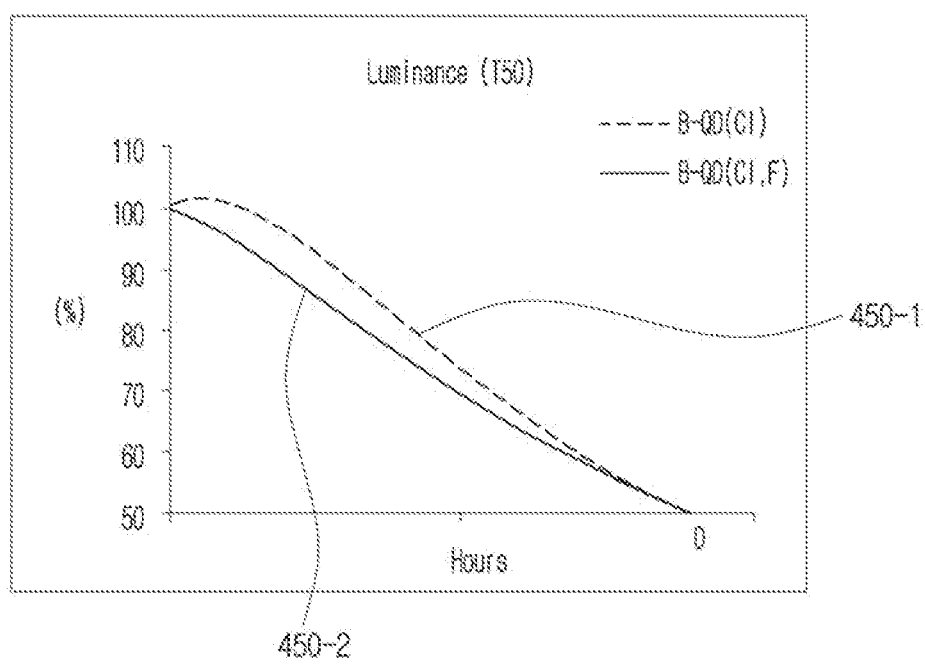
FIG. 4E is a diagram for explaining the lifespan of the quantum dot generating blue light according to one or more embodiments of the disclosure.

FIG. 4E is a diagram for explaining the lifespan of the quantum dot generating blue light according to one or more embodiments of the disclosure.

The vertical axis corresponds to luminance of light generated from the quantum dot, and the horizontal axis corresponds to time, that is, lifespan.

Referring to FIG. 4E, it is observed that the lifetime of the quantum dot 100 to which chlorine (Cl) and fluorine (F) are introduced as the halogen elements 130 is longer by about 0.7 hours than that of the quantum dot 100 to which only chlorine (Cl) is introduced as the halogen elements 130.

Therefore, it can be seen that the lifetime of the quantum dot 100, i.e., the light emitting device 10 of the display panel, is improved when chlorine (Cl) and fluorine (F) are introduced together as the halogen elements 130 over that when only chlorine (Cl) is introduced as the halogen elements 130.

Hereinafter, regarding monolayers constituting the shell 120-2 included in the quantum dot 100, the quantum dot 100 in which the halogen elements 130 are introduced into the monolayers and the effect of improving the performance of the quantum dot 100 depending on the number of monolayers will be explained.

The shell 120-2 may include a plurality of monolayers stacked. The number per unit volume of halogen elements 130 present on a surface of an outermost monolayer of the shell 120-2 may be larger than the number per unit volume of halogen elements 130 present on the monolayers other than the outermost monolayer of the shell 120-2.

Here, the shell 120-2 may include halogen elements 130 of two or more types on the outermost monolayer of the shell 120-2. Here, the halogen elements of two or more types included on the outermost monolayer of the shell 120 may be chlorine (Cl) and fluorine (F), but are not limited thereto.

In addition, the halogen elements 130 present inside the outermost monolayer except the surface of the outermost monolayer of the shell 120-2 and on the other monolayers except the outermost monolayer may be only chlorine (Cl), but are not limited thereto.

The halogen elements 130 present on the surface of the outermost monolayer of the shell 120-2 may be present in a doped state or in a metal halide state.

In addition, the shell 120-2 may include a plurality of monolayers stacked, and the number of monolayers may be controlled to the condition in which the effect of improving the performance of the quantum dot 100 is most excellent. According to one or more embodiments, the number of the plurality of monolayers may be 8 or more and 20 or less, but is not limited thereto.

Figure 5A:
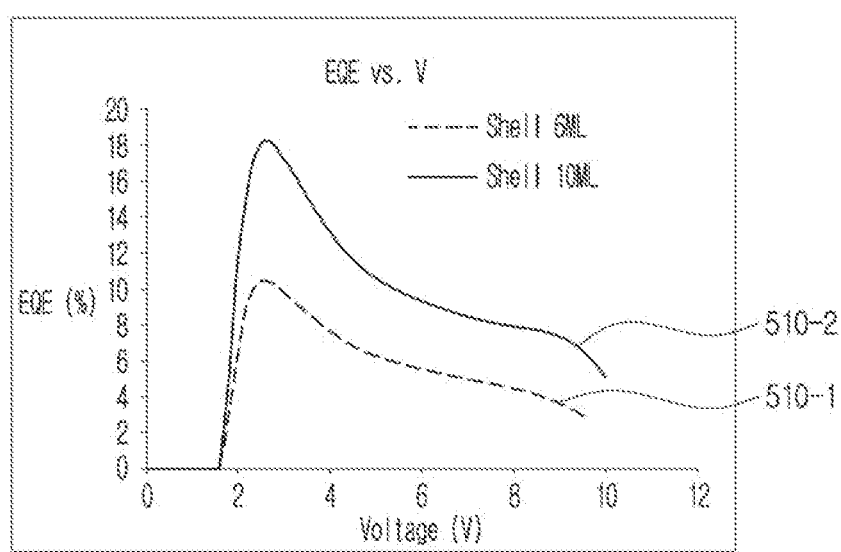
FIG. 5A is a diagram for explaining external quantum efficiency depending on the number of monolayers constituting the quantum dot according to one or more embodiments of the disclosure.

FIG. 5A is a diagram for explaining external quantum efficiency depending on the number of monolayers constituting the quantum dot according to one or more embodiments of the disclosure.

Referring to FIG. 5A, it can be seen that a graph 510-2 corresponding to the external quantum efficiency of the quantum dot when the number of monolayers included in the shell 120 is ten shows a larger external quantum efficiency value than a graph 510-1 corresponding to the external quantum efficiency of the quantum dot when the number of monolayers included in the shell 120 is six.

Figure 5B:
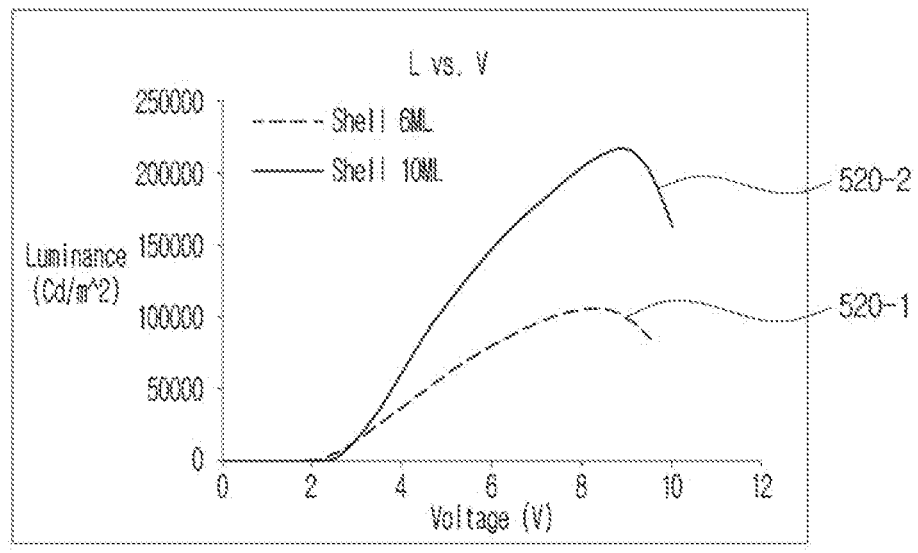
FIG. 5B is a diagram for explaining luminance depending on the number of monolayers constituting the quantum dot according to one or more embodiments of the disclosure.

FIG. 5B is a diagram for explaining luminance depending on the number of monolayers constituting the quantum dot according to one or more embodiments of the disclosure.

Referring to FIG. 5B, it can be seen that a graph 520-2 corresponding to the luminance of the quantum dot when the number of monolayers included in the shell 120 is ten shows a larger luminance value than a graph 520-1 corresponding to the luminance of the quantum dot when the number of monolayers included in the shell 120 is six.

Therefore, it can be seen that the effect of improving the performance of the quantum dot 100 is excellent when the number of monolayers included in the shell 120 is ten, and the excellent performance improvement effect can be exhibited when the number of monolayers is in the range of 8 or more and 20 or less.

Depending on the number of monolayers as well as the number of halogen elements 130 introduced to the shell 120 of the quantum dot 100 described above, the effect of improving the efficiency and lifespan of the quantum dot 100 is expected.

In addition, the light emitting device 10 of the display panel including the quantum dot 100 according to the disclosure may be used in various display devices such as TVs, computers, tablets, smartphones, and wearable devices, but is not limited thereto.

Although example embodiments of the disclosure have been illustrated and described above, the disclosure is not limited to the specific embodiments described above, and various modifications may be made by those skilled in the art without departing from the gist of the disclosure as claimed in the appended claims. Such modifications should not be individually understood from the technical spirit or prospect of the disclosure.

What is claimed is:

1. A quantum dot of a light emitting device, the quantum dot comprising:

a core; and a shell around the core and comprising halogen elements of at least one type, wherein a first number per unit volume of halogen elements in a first area of the shell, that includes an outer surface of the shell, is larger than a second number per unit volume of halogen elements in a second area of the shell other than the outer surface of the shell.

2. The quantum dot as claimed in claim 1, wherein the halogen elements in the first area of the shell comprise halogen elements of two or more types, and the halogen elements in the second area of the shell comprise halogen elements of one type.

3. The quantum dot as claimed in claim 1, wherein the halogen elements comprise at least one of fluorine, chlorine, bromine, or iodine, and wherein the halogen elements are in a doped state or a metal halide state inside the shell or on the outer surface of the shell.

4. The quantum dot as claimed in claim 1, wherein the shell comprises a plurality of monolayers stacked on each other, and wherein the outer surface of the shell is an outermost monolayer of the plurality of monolayers.

5. The quantum dot as claimed in claim 1, wherein the shell comprises a plurality of monolayers stacked on each other, and wherein a number of the plurality of monolayers is in a range from 8 to 20.

6. The quantum dot as claimed in claim 1, wherein the core comprises a Group III-V compound, and wherein the Group III-V compound is at least one of:

a binary element compound selected from the group consisting of GaN, GaP, GaAs, GaSb, AlN, AlP, AlAs, AlSb, InN, InP, InAs, InSb, and mixtures thereof;

a ternary element compound selected from the group consisting of GaNP, GaNAs, GaNSb, GaPAs, GaPSb, AlNP, ANAs, AlNSb, AlPAs, AlPSb, InNP, InNAs, InNSb, InPAs, InPSb, and mixtures thereof; or a quaternary element compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof.

7. The quantum dot as claimed in claim 1, wherein the core comprises a Group II-VI compound, and wherein the Group II-VI compound is at least one of:

a binary element compound selected from the group consisting of ZnS, ZnSe, ZnTe, ZnO, HgS, HgSe, HgTe, MgSe, MgS, and mixtures thereof;

a ternary element compound selected from the group consisting of ZnSeS, ZnSeTe, ZnSTe, HgSeS, HgSeTe, HgSTe, HgZnS, HgZnSe, HgZnTe, MgZnSe, MgZnS, and mixtures thereof; or a quaternary element compound selected from the group consisting of HgZnTeS, HgZnSeS, HgZn-SeTe, HgZnSTe, and mixtures thereof.

8. The quantum dot as claimed in claim 1, wherein the quantum dot has a quantum yield of at least 70%.

9. A display panel comprising:

a substrate; and a light emitting device provided on the substrate and comprising at least one quantum dot, wherein the at least one quantum dot comprises:

a core; and a shell around the core and comprising halogen elements of at least one type, and wherein a first number per unit volume of the halogen elements in a first area of the shell, that includes an outer surface of the shell, is larger than a second number per unit volume of the halogen elements in a second area of the shell other than the outer surface of the shell.

10. The display panel as claimed in claim 9, wherein the halogen elements in the first area of the shell comprise halogen elements of two or more types, and wherein the halogen elements in the second area of the shell comprise halogen elements of one type.

11. The display panel as claimed in claim 9, wherein the halogen elements comprise at least one of fluorine, chlorine, bromine, or iodine, and wherein the halogen elements are in a doped state or a metal halide state inside the shell or on the outer surface of the shell.

12. The display panel as claimed in claim 9, wherein the shell comprises a plurality of monolayers stacked on each other, and wherein the outer surface of the shell is an outermost monolayer of the plurality of monolayers.

13. The display panel as claimed in claim 9, wherein the shell comprises a plurality of monolayers stacked on each other, and wherein a number of the plurality of monolayers is in a range from 8 to 20.

14. The display panel as claimed in claim 9, wherein the core comprises a Group III-V compound, and wherein the Group III-V compound is at least one of:

a binary element compound selected from the group consisting of GaN, GaP, GaAs, GaSb, AlN, AlP, AlAs, AlSb, InN, InP, InAs, InSb, and mixtures thereof;

a ternary element compound selected from the group consisting of GaNP, GaNAs, GaNSb, GaPAs, GaPSb, AlNP, ANAs, AlNSb, AlPAs, AlPSb, InNP, InNAs, InNSb, InPAs, InPSb, and mixtures thereof; or a quaternary element compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof.

15. The display panel as claimed in claim 9, wherein the core comprises a Group II-VI compound, and wherein the Group II-VI compound is at least one of:

a binary element compound selected from the group consisting of ZnS, ZnSe, ZnTe, ZnO, HgS, HgSe, HgTe, MgSe, MgS, and mixtures thereof;

a ternary element compound selected from the group consisting of ZnSeS, ZnSeTe, ZnSTe, HgSeS, HgSeTe, HgSTe, HgZnS, HgZnSe, HgZnTe, MgZnSe, MgZnS, and mixtures thereof; or a quaternary element compound selected from the group consisting of HgZnTeS, HgZnSeS, HgZn-SeTe, HgZnSTe, and mixtures thereof.

16. The display panel as claimed in claim 9, wherein the quantum dot has a quantum yield of at least 70%.

* * * * *